March 4, 1958 J. C. LOGUE 2,825,821
LATCH CIRCUIT
Filed Jan. 3, 1955
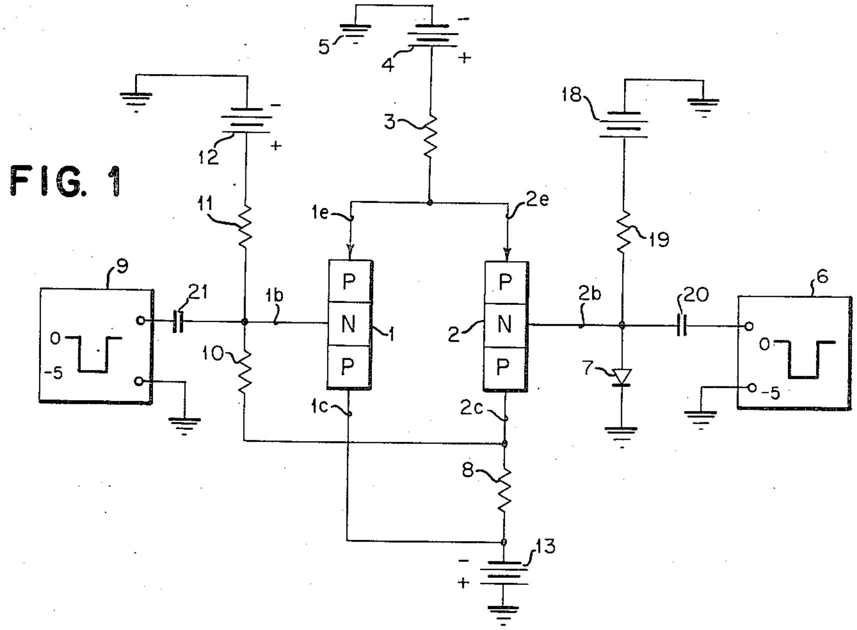
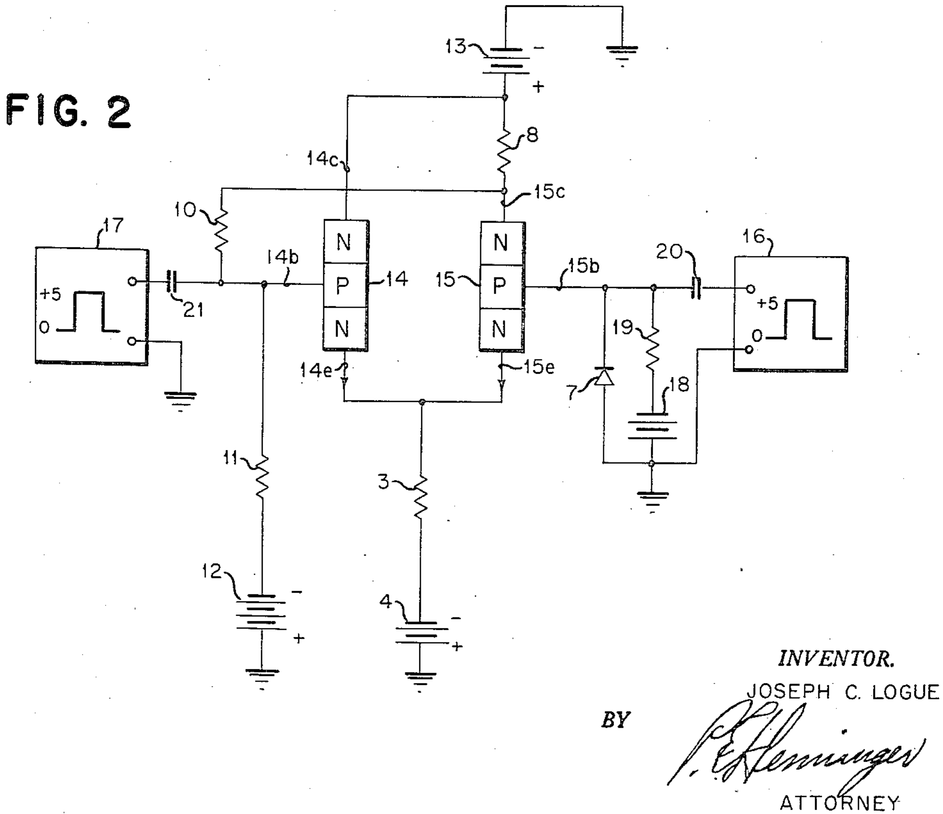
INVENTOR.
JOSEPH C. LOGUE
BY [signature]
ATTORNEY United States Patent Office 2,825,821

Patented Mar. 4, 1958

2,825,821

LATCH CIRCUIT

Joseph C. Logue, Poughkeepsie, N. Y., assignor to International Business Machines Corporation, New York, N. Y., a corporation of New York Application January 3, 1955, Serial No. 479,363

4 Claims. (Cl. 307—88.5)

This invention relates to latch circuits and particularly to latch circuits comprising transistors.

A latch circuit may be defined as a bistable circuit having two inputs, and shiftable from one of its stable states to the other and return in response to input signals applied alternately to the two inputs. That is to say, an input signal at one input latches the circuit in a particular one of its stable states, and it is not released from that stable state to its other stable state until a signal is received a the opposite input.

An object of the present invention is to provide an improved latch circuit employing transistors.

Another object of the invention is to provide a simplified latch circuit employing junction transistors.

These and other objects of the invention are attained, in the circuits described herein by providing a circuit including two transistors having their emitters connected in parallel with a common current limiting resistor, said resistor having a resistance sufficient to limit the current to a value effective to maintain only one of the two transistors conductive. This connection of the emitters provides a first cross-feedback connection between the transistors. The two inputs are connected to the respective bases of the two transistors, and a second cross-feedback connection is provided between the collector of one transistor and the base of the opposite one.

Other objects and advantages of the invention will become apparent from a consideration of the following specification and claims, taken together with the accompanying drawing.

In the drawing:

Fig. 1 is a wiring diagram of a latch circuit embodying the present invention and using two PNP junction transistors; and Fig. 2 is a wiring diagram of a modification of the circuit of Fig. 1, using NPN junction transistors.

FIG. 1

The circuit of this figure includes transistors 1 and 2, having emitter electrodes 1*e* and 2*e*, base electrodes 1*b* and 2*b*, and collector electrodes 1*c* and 2*c*. The transistors 1 and 2 are PNP junction transistors.

The emitters 1*e* and 2*e* are connected to one terminal of a current limiting resistor 3, and through the resistor 3 and a battery 4 to a ground connection 5. Base 2*b* is connected through a capacitor 20 to a signal generator 6, which may be of any suitable construction and is illustrated graphically as producing a square wave signal which shifts from a no signal potential of "0" volts to a signal potential of —5 volts. Base 2*b* is also connected through a diode 7 to ground and through a resistor 19 to the positive terminal of battery 18 which negative terminal is grounded. Collector 2*c* is connected through a load resistor 8 and a load supply battery 1 to ground.

Base 1*b* is connected through a capacitor 21 to a signal generator 9 which may be similar in structure and function to the signal generator 6. Base 1*b* is also connected through a resistor 10 to collector 2*c*, and through a resistor 11 and a biasing battery 13 to ground. Collector 1*c* is connected directly to the negative terminal of battery 13.

The common connection of the emitters 1*e* and 2*e* provides a first cross-feedback between the two transistors, and the connection between collector 2*c* and base 1*b* through resistor 10 provides a second cross-feedback.

Resistors 11, 10 and 8 form a voltage divider between the positive terminal of battery 12 and the negative terminal of battery 13. Some of these resistors at times have other functions. Resistor 11 and battery 12 function as a constant current generator for this voltage divider.

*Operation of Fig. 1*

In order to clarify the description of the operation of the circuit, certain impedance and potential values will be used. It should be clearly understood that the invention is not limited to the use of these values nor any of them. Consider that the transistor 1 is "on" and the transistor 2 is "off." The value of resistor 3 is chosen so that substantially all the current flowing through it from battery 4 is required to flow through one of the emitters 1*e* and 2*e* in order to maintain the corresponding transistor conductive. Since transistor 2 is "off," the only potential drop across resistor 8 is that due to the current through the voltage divider.

With the impedance and potential values shown in the table below, this potential drop is about 1 volt, so that collector 2*c* is at —4 volts. The potential drop across resistor 10 is 2.7 volts, so that base 1*b* is at —1.3 volts. Emitter 1*e* is only a small fraction of a volt (e. g. 0.3 volt) more positive than base 1*b*. Emitter 2*e* is at the same potential, i. e., —1 volt, and since base 2*b* is grounded, transistor 2 is cut off.

Now assume that a negative square wave potential of —5 volts is transmitted from generator 6 to base 2*b*. The emitter-base impedance of transistor 2 thereby becomes very low, the potential of the emitters falls below that of base 1*b*, and the current flow through resistor 3 is robbed from emitter 1*e* and switches through emitter 2*e*, turning transistor 2 "on" and transistor 1 "off." Collector 2*c* now swings to substantially ground potential, in view of the low impedance between base 2*b* and collector 2*c*, and base 1*b* therefore swings to +2.7 volts due to the drop across resistor 10. After the input signal from generator 6 terminates, the emitters swing to ground potential, but transistor 1 is held "off" by the positive potential at its base.

Now assume that a negative square wave signal is received from generator 9 at base 1*b*. This lowers the emitter-to-base impedance of transistor 1 and the potential of the emitters falls below that of base 2*b*. The current from resistor 3 is switched through emitter 1*e*, thereby turning transistor 2 "off" and turning transistor 1 "on." Transistor 2 going "off" changes the potential of collector 2*c* to substantially —4 volts, as before and the voltage divider 10, 11 is again effective to keep the transistor 1 "on" and the transistor 2 "off."

The diode 7 is effective to clamp the base 2b and keep it from going positive. Such a clamp makes the base 2*b* more sensitive to negative going input signals from generator 6. Resistor 19 and battery 18 insure that base 2*b* operates at ground potential, and could be omitted in some circuits. The transistor 1 may be considered as a part of a grounded collector amplifier stage, whereas the transistor 2 is part of a grounded base amplifier stage.

Transistor 2 may be operated with a relatively low alpha. Transistor 1 is never operated in its saturated region, and so may have its alpha as high as desired without encountering trouble from minority carrier storage.

Diode 7 may be replaced by a resistor of 1K or 2K ohms, but more power would be required.

FIG. 2

This figure illustrates a circuit similar to Fig. 1, except that it uses NPN junction transistors 14 and 15 in place of the PNP transistors 1 and 2 of Fig. 1. The transistors 14 and 15 have emitter electrodes 14*e*, 15*e*, base electrodes 14*b* and 15*b*, and collector electrodes 14*c* and 15*c*. The other circuit elements correspond to those of Fig. 1, and have been given the same reference numerals. Note that the polarities of the diode 7 and of the batteries 4, 12, 13 and 18 have been reversed. Signal generators 16 and 17, which produce positive going square wave signals, replace the negative going signal generators 6 and 9 of Fig. 1. The operation of the circuit of Fig. 2 is analogous to the operation of the circuit of Fig. 1, and it is considered that no detailed description is necessary.

The following table shows, by way of example, particular values for the potentials of the various batteries and for the impedances of the various resistors and capacitors, in circuits which have been operated successfully. In some cases, the values are also shown in the drawing. These values are set forth by way of example only and the invention is not limited to them nor to any of them. The diodes may be germanium diodes, and are considered to have substantially no impedance in their forward direction and substantially infinite impedance in the reverse direction.

TABLE I

| | | |
|---|---|---|
| Resistor 3 | ohms | 1K |
| Battery 4 | volts | 5 |
| Resistor 8 | ohms | 1K |
| Resistor 10 | do | 2.7K |
| Resistor 11 | do | 47K |
| Battery 12 | volts | 45 |
| Battery 13 | do | 5 |
| Battery 18 | do | 45 |
| Resistor 19 | ohms | 470K |

While I have shown and described certain preferred embodiments of my invention, other modifications thereof will readily occur to those skilled in the art, and I therefore intend my invention to be limited only by the appended claims.

What is claimed is:

1. A latch circuit comprising: first and second transistors, each having an emitter electrode, a base electrode and a collector electrode; a load supply source of electrical potential, means connecting one terminal of the load supply source to a common terminal, means electrically connecting the other terminal of the load supply source directly to the collector electrode of the first transistor, a load resistor, means including said load resistor electrically connecting said other terminal of the load supply source to the collector electrode of the second transistor; a first cross-feedback comprising a direct connection between said emitter electrodes, a first source of biasing potential, a second resistor, means connecting said emitter electrodes through said second resistor to a terminal of said first biasing source poled to bias said emitter electrodes in a current flow increasing sense, said second resistor being effective to limit the current from said first biasing source to a value sufficient to maintain one only of said transistors conductive, means connecting the other terminal of said first biasing source to said common terminal; means biasing the base electrode of the second transistor to a potential tending to hold said second transistor "off;" a second cross-feedback comprising a second source of biasing potential, a third resistor connected between a terminal of said second biasing source and the base electrode of the first transistor, a fourth resistor connected between the base electrode of the first transistor and the collector electrode of the second transistor, said second cross-feedback being effective when the second transistor is "off" to bias the base electrode of the first transistor to a potential tending to hold the first transistor "on" and effective when the second transistor is "on" to bias the base electrode of the first transistor to a potential tending to hold the first transistor "off," and means connecting the other terminal of said second biasing source to the common terminal; and a pair of signal inputs, each connected to one of said base electrodes and shiftable between a no-signal potential substantially equal to the potential of said common terminal and a signal potential substantially shifted from said common terminal potential in a sense effective to switch its associated transistor "on."

2. A latch circuit as defined in claim 1, including a diode connected between the base electrode of said second transistor and the common terminal, and poled to prevent a shift of the base electrode potential from the potential of the common terminal in a sense tending to turn said second transistor "off."

3. A latch circuit as defined in claim 2, in which said transistors are PNP junction transistors, said common terminal is ground, said signal inputs supply negative-going signals, and said diode is poled to prevent said base electrode of the second transistor from going positive with respect to ground potential.

4. A latch circuit as defined in claim 2, in which said transistors are NPN junction transistors, said common terminal is ground, said signal inputs supply positive-going signals, and said diode is poled to prevent said base electrode of the second transistor from going negative with respect to ground potential.

References Cited in the file of this patent

UNITED STATES PATENTS

| | | |
|---|---|---|
| 2,651,728 | Wood | Sept. 8, 1953 |
| 2,655,609 | Shockley | Oct. 13, 1953 |